(12) United States Patent
Bhuyan et al.

(10) Patent No.: US 10,892,157 B2
(45) Date of Patent: Jan. 12, 2021

(54) METHODS FOR DEPOSITING BLOCKING LAYERS ON CONDUCTIVE SURFACES

(71) Applicant: Applied Materials, Inc., Santa Clara, CA (US)

(72) Inventors: Bhaskar Jyoti Bhuyan, San Jose, CA (US); Mark Saly, Santa Clara, CA (US); Wenyi Liu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/229,659

(22) Filed: Dec. 21, 2018

(65) Prior Publication Data

US 2019/0198318 A1 Jun. 27, 2019

Related U.S. Application Data

(60) Provisional application No. 62/610,147, filed on Dec. 22, 2017.

(51) Int. Cl.
| | |
|---|---|
| *H01L 21/02* | (2006.01) |
| *H01L 21/321* | (2006.01) |
| *H01L 21/32* | (2006.01) |
| *C23C 16/04* | (2006.01) |

(52) U.S. Cl.
CPC ........ *H01L 21/02312* (2013.01); *C23C 16/04* (2013.01); *H01L 21/0217* (2013.01); *H01L 21/02068* (2013.01); *H01L 21/02211* (2013.01); *H01L 21/02271* (2013.01); *H01L 21/321* (2013.01); *H01L 21/32* (2013.01)

(58) Field of Classification Search
None
See application file for complete search history.

(56) References Cited

U.S. PATENT DOCUMENTS

| | | | |
|---|---|---|---|
| 6,323,131 | B1 | 11/2001 | Obeng et al. |
| 2003/0147058 | A1 | 8/2003 | Murakami et al. |
| 2004/0213971 | A1 | 10/2004 | Colburn et al. |
| 2011/0104595 | A1 | 5/2011 | Hayashi et al. |

(Continued)

FOREIGN PATENT DOCUMENTS

| | | |
|---|---|---|
| CN | 1900359 A | 1/2007 |
| TW | 201331699 A | 8/2013 |

OTHER PUBLICATIONS

Zoń et al. "Synthesis of Phosphonic Acids and Their Esters as Possible Substrates for Reticular Chemistry" 2012, RCS publishing, Chapter 6, total pages 36. (Year: 2012).*

(Continued)

*Primary Examiner* — Bo B Jang
(74) *Attorney, Agent, or Firm* — Servilla Whitney LLC

(57) ABSTRACT

Methods of selectively depositing blocking layers on conductive surfaces over dielectric surfaces are described. In some embodiments, a carboxylic acid is exposed to a substrate to selectively form a blocking layer. In some embodiments, a hydrazide is exposed to a substrate to selectively form a blocking layer. In some embodiments, an alkyl phosphonic acid is exposed to a substrate to selectively form a blocking layer. In some embodiments, the alkyl phosphonic acid is formed in-situ and exposed to the substrate. In some embodiments, a layer is selectively deposited on the dielectric surface after the blocking layer is formed.

8 Claims, 1 Drawing Sheet

(56) References Cited

U.S. PATENT DOCUMENTS

| | | |
|---|---|---|
| 2012/0088315 A1 | 4/2012 | Merelle et al. |
| 2013/0162726 A1* | 6/2013 | Mizukami ............... H01L 27/20 347/70 |
| 2013/0217238 A1 | 8/2013 | Boussie et al. |
| 2017/0062210 A1* | 3/2017 | Visser ................. C23C 16/0236 |
| 2017/0092533 A1 | 3/2017 | Chakraborty et al. |
| 2017/0140920 A1* | 5/2017 | Amepalli ............ H01L 21/0262 |
| 2017/0256402 A1 | 9/2017 | Kaufman-Osborn et al. |

OTHER PUBLICATIONS

Herregods, Sebastiaan J.F., et al., "Vapour phase self-assembled monolayers for ALD blocking on 300 mm wafer scale".
Jadhav, Sushilkumar A., "Self-assembled monolayers (SAMs) of carboxylic acids: an overview", Central European Journal of Chemistry, 369-378.
Snow, A. W., et al., "Packing density of HS(CH2)nCOOH self-assembled monolayers", Analyst, 2011, 136, 4935, 4935-4949.
PCT International Search Report and Written Opinion in PCT/US2018/067108, dated May 27, 2019, 13 pages.

\* cited by examiner

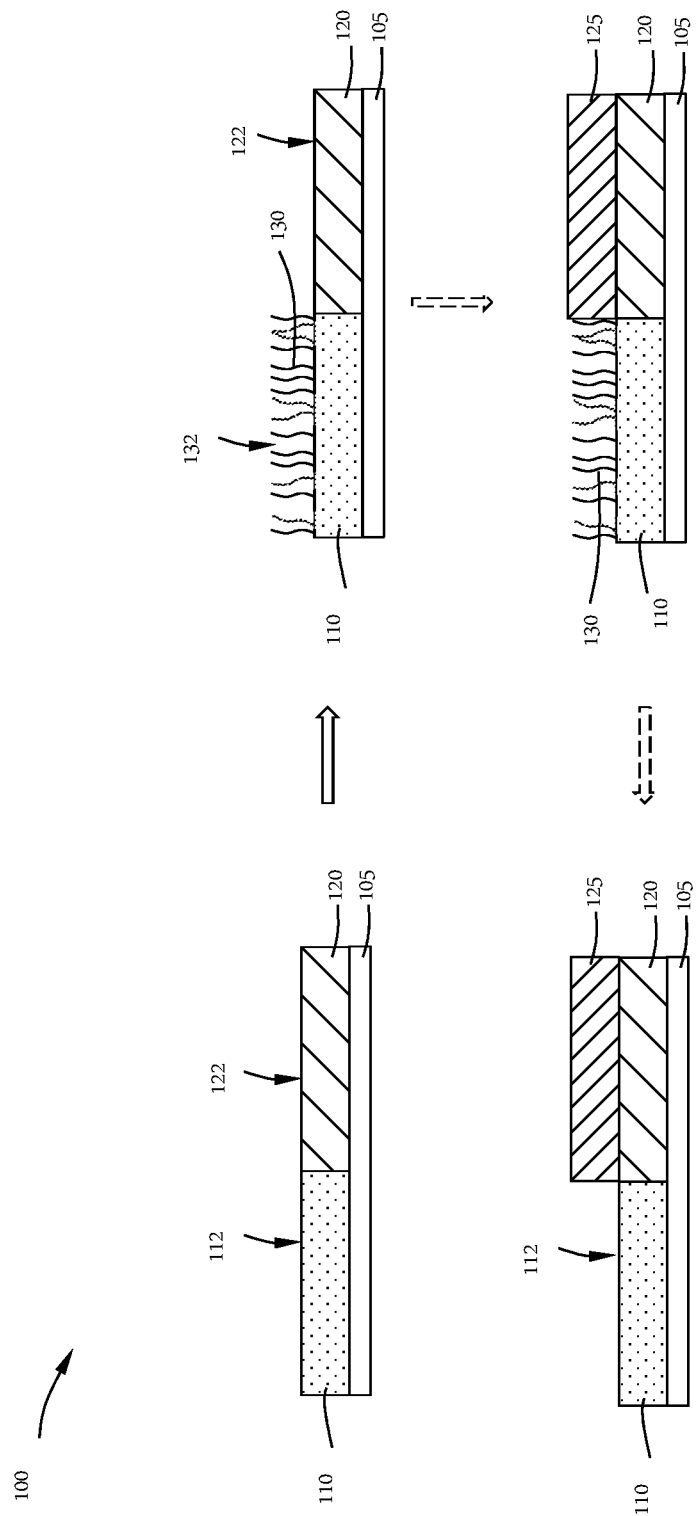

METHODS FOR DEPOSITING BLOCKING LAYERS ON CONDUCTIVE SURFACES

CROSS-REFERENCE TO RELATED APPLICATIONS

This application claims priority to U.S. Provisional Application No. 62/610,147, filed Dec. 22, 2017, the entire disclosure of which is hereby incorporated by reference herein.

FIELD

Embodiments of the disclosure relate methods for depositing blocking layers on conductive surfaces. More particularly, embodiments of the disclosure are directed to methods of depositing blocking layers on conductive surfaces to facilitate the deposition of films on the dielectric surfaces of patterned substrates.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

There is an ongoing need in the art for treatment methods to deactivate or block conductive surfaces.

SUMMARY

One or more embodiments of this disclosure relate to a method of selectively depositing a blocking layer. The method comprises exposing a substrate comprising a conductive material having a first surface and a dielectric material having a second surface to a carboxylic acid to selectively form a blocking layer on the first surface over the second surface and form a blocked first surface. The carboxylic acid comprises at least one compound with a general formula RCOOH, where R is selected from C4-C20 alkyl, perfluoroalkyl, alkenyl or alkynyl groups.

Additional embodiments of this disclosure relate to a method of selectively depositing a blocking layer. The method comprises exposing a substrate comprising a conductive material having a first surface and a dielectric material having a second surface to a hydrazide to selectively form a blocking layer on the first surface over the second surface and form a blocked first surface. The hydrazide comprises at least one compound with a general formula $RC(O)NHNR'_2$, where R is selected from C4-C20 alkyl, perfluoroalkyl, alkenyl or alkynyl groups and each R' is independently selected from H or C1-C4 alkyl or can join together to form a ring comprising 2 to 5 carbon atoms.

Further embodiments of this disclosure relate to a method of selectively depositing a blocking layer. The method comprises exposing a substrate comprising a conductive material having a first surface and a dielectric material having a second surface to a gaseous alkyl phosphonic acid to selectively form a blocking layer on the first surface over the second surface and form a blocked first surface. The alkyl phosphonic acid comprises at least one compound with a general formula $RP(O)(OR'')_2$, where R is selected from C4-C20 alkyl, perfluoroalkyl, alkenyl or alkynyl groups and each R" is independently selected from H, C1-C12 alkyl or aryl.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE illustrates a processing method in accordance with one or more embodiment of the disclosure.

In the appended FIGURES, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments of the disclosure provide methods for selectively depositing blocking layers on conductive surfaces. Embodiments of the disclosure identify methods for depositing blocking layers which may be used separately or in conjunction.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

Embodiments of the disclosure advantageously provide methods for selectively forming a blocking layer on a conductive surface over a dielectric surface. Some embodiments advantageously provide further methods to selectively deposit a layer on a dielectric surface.

As used in this specification and the appended claims, the phrase "conductive surface" or "dielectric surface" means that the surface relates to a material with the stated property. Accordingly, a conductive surface is the surface of a conductive material, but no statement is being presented regarding the conductivity of the surface per say. Similarly, a dielectric surface is the surface of a dielectric material.

As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface. Stated differently, the selectivity for the subject material relative to the non-selected surface is greater than or equal to about 10:1, 15:1, 20:1, 25:1, 30:1, 35:1, 40:1, 45:1 or 50:1.

Some embodiments of the disclosure incorporate a blocking layer typically referred to as a self-assembled monolayer (SAM). A self-assembled monolayer (SAM) consists of an ordered arrangement of spontaneously assembled organic molecules adsorbed on a surface. These molecules are typically comprised of one or more moieties with an affinity for the substrate (head group) and a relatively long, inert, linear hydrocarbon moiety (tail group).

In this case, SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs can be removed through thermal decomposition (with desorption of any byproducts) or an integration-compatible ashing process.

One or more embodiments of this disclosure are directed to methods of selectively depositing a blocking layer on a first surface of a substrate over a second surface. The first surface is a surface of a conductive material. The second surface is a surface of a dielectric material.

The conductive material of the substrate may be any suitable material. Suitable conductive materials include, but are not limited to, metals, metal nitrides, some metal oxides, metal alloys, combinations thereof and other conductive materials. In some embodiments, the conductive material comprises one or more of chromium, manganese, iron, copper, nickel, cobalt, tungsten, ruthenium, tantalum oxide, tantalum nitride, titanium oxide or titanium nitride. In some embodiments, the conductive material consists essentially of chromium, manganese, iron, copper, nickel, cobalt, tungsten, ruthenium, tantalum oxide, tantalum nitride, titanium oxide or titanium nitride. As used in this specification and the appended claims, the term "consists essentially of" means that the material is greater than or equal to about 95%, 98% or 99% of the stated material on an atomic basis.

As used in this specification and the appended claims, the term "oxide" or the like means that the material contains the specified element(s). The term should not be interpreted to imply a specific ratio of elements. Accordingly, an "oxide" or the like may comprise a stoichiometric ratio of elements or a non-stoichiometric ratio of elements.

The dielectric material of the substrate may be any suitable material. Suitable dielectric materials include, but are not limited to, silicon oxides (e.g. $SiO_2$), silicon nitrides, silicon carbides and combinations thereof (e.g. SiCON). In some embodiments, the dielectric material consists essentially of silicon dioxide ($SiO_2$). In some embodiments, the layer comprises silicon nitride. In some embodiments, the layer consists essentially of silicon nitride.

Referring to the FIGURE, a generalized method 100 begins with a substrate 105 comprising a conductive material 110 having a first surface 112 and a dielectric material 120 having a second surface 122. The substrate 105 is exposed to a blocking compound (not shown) to selectively form a blocking layer 130 on the first surface 112 over the second surface 122 and form a blocked first surface 132.

In some embodiments, the method 100 continues by selectively depositing a layer 125 on the second surface 122 over the blocked first surface 132. In some embodiments, the layer 125 is a dielectric material. In some embodiments, the layer comprises silicon nitride.

Deposition of silicon nitride can be performed through any suitable process. Suitable processes may include exposure of the substrate to a silicon halide and ammonia. Suitable silicon halides include, but are not limited to dichlorosilane (DCS), trichlorosilane (TCS), tetrachlorosilane ($SiCl_4$), tetrabromosilane ($SiBr_4$), tetraiodosilane ($SiI_4$), and hexachlorodisilane (HCDS).

In some embodiments, the silicon nitride layer is deposited with a thickness in the range of about 10 Å to about 50 Å, or in the range of about 12 Å to about 35 Å, or in the range of about 15 Å to about 20 Å. In some embodiments, formation of the blocking layer and deposition of the layer are repeated until the layer has a thickness of greater than or equal to about 50 Å, greater than or equal to about 75 Å, greater than or equal to about 100 Å or greater than or equal to about 150 Å.

In some embodiments, the method 100 continues by removing the blocking layer 130 to expose the first surface 112. In some embodiments, the blocking layer 130 is removed using selective etching processes. Oxygen-based and fluorine-based etches are known to etch carbon based films similar to the blocking layer disclosed herein.

One non-limiting example is removing the blocking layer via an oxygen-based remote plasma. In this example the oxygen-based remote plasma etch removes the blocking layer but also oxidizes the first surface. To recover the original surface composition, the surface can be reduced. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled.

Although not shown in the FIGURE, methods of this disclosure may further comprise cleaning the first surface before exposing the substrate to the blocking compound. In some embodiments, cleaning the first surface comprises exposing the first surface to a solution comprising acetic acid and ethanol. In some embodiments, the solution is a 10% ethanolic solution of acetic acid (i.e., 10% v/v acetic acid in ethanol or 10% w/w acetic acid in ethanol). In some embodiments, cleaning the first surface comprises exposing the first surface to a plasma of hydrogen gas ($H_2$). In some embodiments, the hydrogen plasma is a conductively coupled plasma (CCP). In some embodiments, the hydrogen plasma is an inductively coupled plasma (ICP). Without being bound by theory, it is believed that cleaning the first surface results in a higher prevalence of H-terminations on the first surface. These terminations are believed to be the reaction sites for the blocking compound.

In some embodiments, the blocking compound comprises a carboxylic acid. In some embodiments, the method comprises exposing a substrate comprising a conductive material having a first surface and a dielectric material having a second surface to a carboxylic acid to selectively form a blocking layer on the first surface over the second surface and form a blocked first surface.

In some embodiments, the carboxylic acid comprises at least one compound with a general formula RCOOH, where R is selected from C4-C20 alkyl, perfluoroalkyl, alkenyl or alkynyl groups. As used in this manner, the letter "C" followed by a numeral (e.g., "C4") means that the substituent comprises the specified number of carbon atoms (e.g., C4 comprises four carbon atoms). In some embodiments, C4-C20 alkyl groups consist essentially of C—C single bonds and C—H bonds. In some embodiments, C4-C20 perfluoroalkyl groups consist essentially of C—C single bonds and C—F bonds. In some embodiments, C4-C20 alkenyl groups consist essentially of C—C single bonds, at least one C—C double bond and C—H bonds. In some embodiments, C4-C20 alkynyl groups consist essentially of C—C single bonds, at least one C—C triple bond and C—H bonds. In some embodiments, the C4-C20 groups include one or more halogen atom and/or other hydrophobic moiety. In some embodiments, the C4-C20 groups can be a straight chain groups (e.g. n-butyl), a branched groups (e.g. t-butyl) or a cyclic groups (e.g. cyclohexyl). In some embodiments, the alkyl, perfluoroalkyl, alkenyl or alkynyl group is a straight chain. In some embodiments, the alkyl, perfluoroalkyl, alkenyl or alkynyl group is a branched chain.

In some embodiments, the carboxylic acid comprises heptanoic acid, octanoic acid, undecanoic acid or ocadecanoic acid. In some embodiments, the carboxylic acid consists essentially of undecanoic acid.

In some embodiments, a long chain carboxylic acid can be used as a blocking molecule and reacted with a metal surface (with or without native oxide). In some embodiments, the exposure to the carboxylic acid is performed in solution. In some embodiments, the exposure to the carboxylic acid is performed in vapor phase.

In some embodiments, small and medium chain length (<C12) carboxylic acids are delivered in vapor phase. In some embodiments, long alkyl chain (≥C12) carboxylic acids can be used as blocking compounds in solution phase.

Without being bound by theory, metals (including but not limited to Cu, Co, W, Ru, TiN) are usually oxophilic and bind to carboxylic acid preferentially as RCOO-M over $SiO_2$ or SiN surface.

In some embodiments, a layer of silicon nitride is selectively deposited on the second surface over the first blocked surface. In some embodiments, a thickness of the layer of silicon nitride is in the range of about 30 Å to about 40 Å. In some embodiments, the layer of silicon nitride is deposited with a selectivity of greater than or equal to about 30:1. In some embodiments, the substrate is maintained at a temperature of less than or equal to about 200° C.

In some embodiments, the blocking compound comprises a hydrazide. In some embodiments, the method comprises exposing a substrate comprising a conductive material having a first surface and a dielectric material having a second surface to a hydrazide to selectively form a blocking layer on the first surface over the second surface and form a blocked first surface.

In some embodiments, the hydrazide comprises at least one compound with a general formula R—C(O)NHNR'$_2$, where R is selected from C4-C20 alkyl, perfluoroalkyl, alkenyl or alkynyl groups and each R' is independently selected from H or C1-C4 alkyl or can join together to form a ring comprising 2 to 5 carbon atoms.

Without being bound by theory, hydrazides are expected to form thermally stable metal complexes. Cobalt-hydrazide complexes such as bis(tert-butyl carbohydrazido)cobalt is relatively less volatile and thermally stable up to 250° C. It is believed that using a longer chain alkyl group can further reduce the vapor pressure and lead to blocking of a conductive surface.

In some embodiments, R is a t-butyl group. In some embodiments, each R' is hydrogen. In some embodiments, each R' is a methyl group.

In some embodiments, the blocking compound comprises a gaseous alkyl phosphonic acid. In some embodiments, the method comprises exposing a substrate comprising a conductive material having a first surface and a dielectric material having a second surface to a gaseous alkyl phosphonic acid to selectively form a blocking layer on the first surface over the second surface and form a blocked first surface. As used in this specification and the appended claims, the descriptor "gaseous" means that the alkyl phosphonic acid is supplied in the vapor phase.

In some embodiments, the alkyl phosphonic acid comprises at least one compound with a general formula R—P(O)(OR")$_2$, where R is selected from C4-C20 alkyl, perfluoroalkyl, alkenyl or alkynyl groups and each R" is independently selected from H, C1-C12 alkyl or aryl.

In some embodiments, the R" is independently a C1-C12 alkyl or aryl. Without being bound by theory, the lack of hydrogen bonding in the alkyl phosphonic acids of these embodiments increase the vapor pressure of these blocking compounds.

In some embodiments, the alkyl phosphonic acid comprises octadecyl phosphonic acid. In some embodiments, the alkyl phosphonic acid comprises perfluorooctyl phosphonic acid.

In some embodiments, the alkyl phosphonic acid is generated in situ by the reaction of a dihaloalkylphosphonic acid and an alcohol. In some embodiments, the dihaloalkylphosphonic acid comprises at least one compound with a general formula RP(O)X$_2$, where each X is an independently selected halogen. In some embodiments, the alcohol comprises at least one compound with a general formula R"OH.

Without being bound by theory, the dihaloalkylphosphonic acid and the alcohol are each more volatile than the alkyl phosphonic acid which they produce. Accordingly, it is possible to deliver both the dihaloalkylphosphonic acid and the alcohol in the vapor phase such that they react to form an alkyl phosphonic acid which would otherwise be difficult to volatilize.

In some embodiments, R" is H. Without being bound by theory, the use of water as the alcohol of these embodiments provides alkyl phosphonic acids in situ which would otherwise have low volatility due to hydrogen bonding.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a blocking layer, the method comprising exposing a substrate comprising a conductive material having a first surface and a dielectric material having a second surface to a gaseous alkyl phosphonic acid to selectively form the blocking layer on the first surface over the second surface and form a blocked first surface, the alkyl phosphonic acid comprising at least one compound with a general formula $RP(O)(OR")_2$, where R is selected from a C4-C20 alkyl group, a C4-C20 perfluoroalkyl group, a C4-C20 alkenyl group or a C4-C20 alkynyl group and each R" is independently selected from C1-C12 alkyl or aryl, wherein the C4-C20 groups are straight chain, branched or cyclic.

2. The method of claim 1, wherein the conductive material comprises a metal, metal alloy, metal oxide, metal nitride, or a combination thereof.

3. The method of claim 2, wherein the conductive material comprises one or more of chromium, manganese, iron, copper, nickel, cobalt, tungsten, ruthenium, tantalum oxide, tantalum nitride, titanium oxide or titanium nitride.

4. The method of claim 1, further comprising selectively depositing a layer on the second surface over the blocked first surface.

5. The method of claim 4, wherein the layer comprises a dielectric material.

6. The method of claim 1, wherein exposing the substrate to the gaseous alkyl phosphonic acid comprises reacting a dihaloalkylphosphonic acid and an alcohol to form the alkyl phosphonic acid, the dihaloalkylphosphonic acid comprising at least one compound with a general formula $RP(O)X_2$, where each X is an independently selected halogen, the alcohol comprising at least one compound with a general formula R"OH.

7. The method of claim 6, further comprising selectively depositing a layer on the second surface over the blocked first surface.

8. The method of claim 7, wherein the layer comprises a dielectric material.

* * * * *